United States Patent [19]

Chenevas-Paule et al.

[11] 4,244,750
[45] Jan. 13, 1981

[54] PHOTOVOLTAIC GENERATOR

[75] Inventors: André Chenevas-Paule; Igor Melnick, both of Grenoble; Line Vieux-Rochaz, Fontaine, all of France

[73] Assignee: Commissariat a l'Energie Atomique, Paris, France

[21] Appl. No.: 62,791

[22] Filed: Aug. 1, 1979

[30] Foreign Application Priority Data

Aug. 2, 1978 [FR] France ............................ 78 22826

[51] Int. Cl.³ .......................................... H01L 31/04
[52] U.S. Cl. .................................. 136/255; 136/258; 357/15; 357/30
[58] Field of Search ............ 136/89 SJ, 89 P, 89 TF; 357/15, 30

[56] References Cited

U.S. PATENT DOCUMENTS 3,175,929  3/1965  Kleinman ............................ 136/89
4,070,206  1/1978  Kressel et al. ..................... 136/89 TF Primary Examiner—Aaron Weisstuch
Attorney, Agent, or Firm—Haseltine, Lake & Waters

[57] ABSTRACT

A basic photovoltaic stack is constituted by a semiconducting layer interposed between a layer forming an ohmic contact and a layer forming a Schottky contact. A second photovoltaic stack having the same structure as the basic stack is formed on this latter and includes one of the layers forming an ohmic or Schottky contact. The layer or layers forming an ohmic contact are connected together so as to constitute a first output terminal of the photovoltaic generator. The layer or layers forming a Schottky contact are connected together so as to constitute a second output terminal of the generator.

8 Claims, 3 Drawing Figures

PHOTOVOLTAIC GENERATOR

This invention relates to a photovoltaic generator and is applicable to the production of electrical power from photon radiations.

It is already known to produce a photovoltaic generator in which the structure consists of a semiconducting layer interposed between a layer forming an ohmic contact and a layer forming a Schottky-type contact. This structure rests on an insulating substrate of glass, for example.

The thickness of the semiconductor must be such as to ensure total absorption of the incident light by virtue of its optical absorption coefficient. Among the generators which fall into this category, those which will be described hereinafter make use of a semiconductor composed of hydrogenated amorphous silicon. However, other types of semiconductor can be employed in the structures according to the invention. As a general rule, the metal layer which forms an ohmic contact with the amorphous silicon is made up of chromium and antimony. The top layer which receives incident photon radiations and forms a Schottky-type contact consists of platinum. The Schottky barrier thus formed is approximately 0.8 V.

The main disadvantage of a photovoltaic generator having the structure described above is that the photovoltaic conversion efficiency obtained is of the order of 5%. This limitation arises from a number of different causes:

- the incident light which strikes the top layer forming a Schottky contact is reflected or absorbed at 75% by said layer; this disadvantage can be circumvented by means of anti-reflecting films deposited on said Schottky layer. In spite of this expedient, it still remains difficult to cause more than 60% of the incident light to penetrate into the semiconductor located beneath said layer which forms a Schottky contact;
- the photons create electron-pairs within the semiconductor; the electrons are collected in a satisfactory manner but the holes which have a small diffusion length (0.1 micron) are collected only in the space charge region of the Schottky contact within the amorphous silicon. This region usually extends to approximately 0.3 micron;
- the series resistance between the Schottky contact and the conducting layer is of high value; in fact, in the semiconductor region which has a hole collection defect, the electrical resistivity is of a high order.

The aim of the invention is to overcome these disadvantages and especially to produce a photovoltaic generator having good penetration of incident photons as well as considerably higher efficiency than that of known photovoltaic generators. The invention also permits a considerable reduction in the series electrical resistance of the generator.

The present invention is directed to a photovoltaic generator comprising a basic photovoltaic stack having a structure consisting of a semiconducting layer interposed between a layer forming an ohmic contact and a layer forming a Schottky-type contact. The distinctive feature of the invention lies in the fact that a second photovoltaic stack having a structure which is identical with that of the basic stack is formed on this latter and includes one of the layers forming an ohmic or Schottky contact. The layer or layers forming an ohmic contact are interconnected so as to constitute a first output terminal of the generator and the layer or layers forming a Schottky contact are interconnected so as to constitute a second output terminal of the generator.

In accordance with a further distinctive feature, the semiconducting layers have the same thickness.

In accordance with a particular feature, the stacks are supported by a transparent insulating substrate.

In accordance with an advantageous feature, the first layer of the first stack which is exposed to photon radiation is preferably a transparent layer.

In accordance with another distinctive feature of the invention, the ohmic and Schottky layers of the different stacks are transparent.

Finally and in accordance with a particular feature, the layer or layers forming a Schottky contact are thin films of platinum.

Further distinctive features and advantages of the invention will become apparent from the following description which is given solely by way of illustration, reference being made to the accompanying drawings, wherein.

Figure 1:
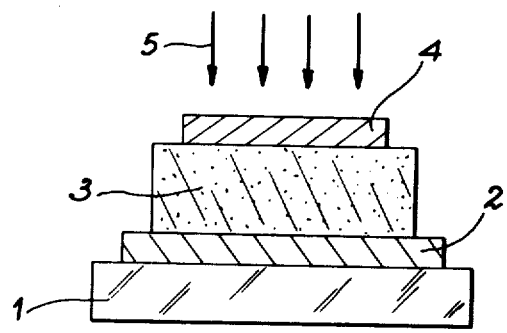
FIG. 1 illustrates a photovoltaic generator which is already known in the prior art.

Referring first to FIG. 1, there is shown a known type of photovoltaic generator comprising an insulating substrate 1 of glass, for example. There have been deposited on said substrate one or a number of metallic film-layers 2 which have good electrical conductivity and provide an ohmic contact with a semiconductor 3 which is in turn deposited on the layer 2. A metallic thin film 4 which has sufficient electrical conductivity and is transparent to light is deposited on the semiconductor 3 and ensures a Schottky-type contact with this latter. The layer 2 forming an ohmic contact with the semiconductor 3 can be constituted by a coating of chromium having a thickness of 1500 Å covered with antimony having a thickness of 300 Å. The thickness of the semiconductor 3 is such that, taking into account it optical absorption coefficient, the incident light 5 is totally absorbed. By way of example, said semiconductor can consist of hydrogenated amorphous silicon. The layer 4 which forms a Schottky contact with the semiconductor 3 can be constituted for example by a layer of platinum having a thickness of 150 Å. This layer produces a Schottky barrier height of approximately 0.8 V within the semiconductor. As mentioned earlier, the efficiency of a photovoltaic generator of this type is approximately 5%.

Figure 2:
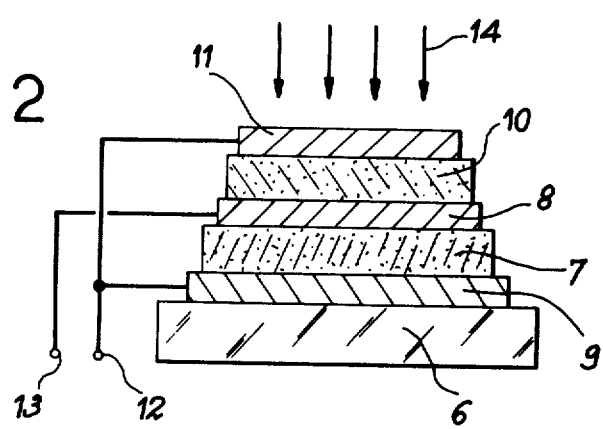
FIG. 2 illustrates a first embodiment of a photovoltaic generator according to the invention.

Referring now to FIG. 2, there is shown a first embodiment of a photovoltaic generator according to the invention. This photovoltaic generator comprises a substrate 6 of glass, for example, and a basic photovoltaic stack having a structure consisting of a semiconducting layer 7 interposed between a layer 8 forming a Schottky contact with the semiconductor, and a layer 9 forming an ohmic contact with said semiconductor. The generator according to the invention comprises a second photovoltaic stack formed on said basic stack and having a structure which is identical with this latter. Said second stack includes the layer 8 which forms a Schottky contact with the semiconductor 7 and also forms a Schottky contact with another semiconducting layer 10, a layer 11 being deposited on said layer 10 so as to form an ohmic contact with this latter. The layers 9 and 11 forming an ohmic contact respectively with the semiconductors 7 and 10 are interconnected so as to constitute a first output terminal 12 of the photovoltaic generator which has thus been constituted. The layer 8 forming a Schottky contact between the semiconductors 7 and 10 constitutes a second output terminal 13 of said generator. The semiconducting layers 7 and 10 can consist of hydrogenated amorphous silicon, for example; the thickness of these layers corresponds to one-half the thickness which is necessary for absorption of the incident light indicated at 14. In the exemplified embodiment herein described, said thickness can be of the order of 0.5 micron. The layer 8 forming a Schottky contact between the two semiconducting layers 7 and 10 has a thickness of approximately 150 Å and can consist of platinum. It is wholly apparent that the semiconducting layers 7 and 10 can have properties which are identical or slightly different so as to optimize the overall efficiency of the generator. The layer 9 can be a thin metal film. In order to ensure transparency, the layer 11 can be constituted, for example, by mixture of indium oxide and antimony oxide ($In_2O_3$-$SbO_2$) having a thickness of at least a few thousand Angstroms (for example 5000 Å). The two conducting layers 9 and 11 which form an ohmic contact are connected so as to constitute a first output terminal of the generator whilst the other output terminal is constituted by the layer which forms a Schottky contact; there are thus obtained two diodes which are disposed optically in series and electrically in parallel.

The photovoltaic generator according to the invention as described in the foregoing with reference to FIG. 1 operates as follows: approximately 90% of the incident photons penetrate into the semiconducting layer 10 and those which are not absorbed by this layer are reflected by the Schottky contact 8, return into the semiconductor 10 and are absorbed. Those photons which are not absorbed by the layer 10 can also be absorbed by the Schottky contact 8 or be transmitted to the semiconducting layer 7 in which they are absorbed.

The number of photons absorbed by the semiconducting layers 7 and 10 is considerably increased with respect to the known photovoltaic device of the prior art described earlier. The generator according to the invention therefore has much higher efficiency.

The space charge region created by the Schottky contact 8 within the semiconducting layers 7 and 10 extends to approximately 0.3 micron on each side of said contact. In comparision with photovoltaic devices of know type, the result thereby achieved is that the minority carrier collection region is doubled. The series electrical resistance of the generator is considerably reduce (by over 75%) and the photoelectric efficiency is considerably increased. It is readily apparent that the number of stacks having an identical structure has been limited to two in The figure but that this number could be increased as a function of the intensity of incident radiations as well as the absorption of the different generator layers.

Figure 3:
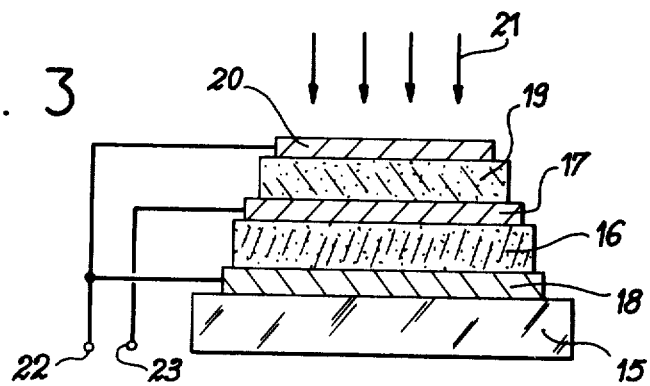
FIG. 3 illustrates another embodiment of a photovoltaic generator according to the invention.

Referring now to FIG. 3, there is shown another embodiment of a photovoltaic generator according to the invention. In this embodiment, the generator comprises a substrate 15 of glass, for example, and, on this substrate, a basic stack constituted by a semiconducting layer 16 interposed between a layer 17 forming an ohmic contact with said semiconducting layer, and a layer 18 forming a Schottky contact with said semiconducting layer. There is formed on said basic stack another stack having the same structure but including the conducting layer 17 which forms an ohmic contact with another semiconducting layer 19 covered with a layer 20 which forms a Schottky contact with said layer 19. The thicknesses and composition of the different layers are similar to the thicknesses and composition of the layers of the generator described in FIG. 2. The intermediate layer 17 forming an ohmic contact between the two semi-conducting layers 16 and 19 is preferably a transparent layer; similarly, the layer 20 forming a Schottky contact with the semiconductor 19 is transparent to the radiation 21. The layers 18 and 20 forming a Schottky contact with the semiconducting layers 16 and 19 are interconnected so as to constitute a first output terminal 22 of the photovoltaic generator; the intermediate layer 17 forming an ohmic contact with the two semiconducting layers 16 and 19 constitutes the second output terminal of said generator. It is readily apparent that the number of stacks having the same structure has been limited to two in this figure but that a greater number can be contemplated.

It is worthy of not that the semiconducting layers of each diode can have different absorptions, thus resulting in enhanced efficiency of the gernerator. The semiconducting layer of the surface diode located nearest the incident light can have higher absorption than that of the second diode; thus the high-energy photons are absorbed by the surface diode whilst the low-energy photons are abosorbed in the deep diode. This can be achieved by employing two semiconductors of hydrogen-doped amorphous silicon with two different concentrations of hydrogen. It is also possible to employ a semiconductor of amorphous silicon for the surface diode and a silicon-germanium alloy for the semiconducting layer of the deep diode.

It is also readily apparent that, in both embodiments hereinabove described and in the case of a greater number of stacks, all the layers forming a Schottky contact are connected together so as to constitute a first output terminal of the generator, and all the layers forming an ohmic contact are connected together so as to constitute the second output terminal of the generator.

The aims mentioned earlier are wholly achieved and the efficiency of the generator according to the invention is considerably higher than the efficiency of known photovoltaic generators of the prior art. Moreover, the electrical connections of the different layers permit a considerable reduction in electrical resistivity of the photovoltaic generator.

We claim:

1. A photovoltaic generator comprising a basic photovoltaic stack having a structure consisting of a semiconducting layer interposed between a layer forming an ohmic contact and a layer forming a Schottky-type contact, wherein at least one additional photovoltaic stack having a structure which is identical with that of the basic stack is formed on said basic stack and includes one of the layers forming an ohmic or Schottky contact, the layer or layers forming an ohmic contact being interconnected so as to constitute a first output terminal of the generator and the layer or layers forming a Schottky contact being interconnected so as to constitute a secnd output terminal of the terminal.

2. A photovoltaic generator according to claim 1, wherein the semiconducting layers have the same thickness.

3. A phtovoltaic generator according to claim 1, wherein the stacks are supported by an insulating substrate.

4. A photovoltaic generator according to claim 3, wherein the insulating substrate is transparent.

5. A phtovoltaic generator according to claim 1, wherein the ohmic and Schottky layers of the stacks are transparent.

6. A photovoltaic generator according to claim 1, wherein the layer or layers forming a Schottky contact are thin films of platinum.

7. A photovoltaic generator according to claim 1, whrein the first layer of the first stack which is exposed to photon radiation is a transparent layer.

8. A photovoltaic generator according to claim 1 wherein the semiconductor layer comprises hydrogenated amorphous silicon.

* * * * *